United States Patent
Kim et al.

(10) Patent No.: US 10,468,620 B2
(45) Date of Patent: Nov. 5, 2019

(54) LIGHTING APPARATUS USING ORGANIC LIGHT EMITTING DEVICE AND METHOD OF FABRICATING THEREOF

(71) Applicant: LG Display Co., Ltd., Seoul (KR)

(72) Inventors: Namkook Kim, Suwon-si (KR); Taejoon Song, Paju-si (KR); Shinbok Lee, Seoul (KR); Soonsung Yoo, Goyang-si (KR); Hwankeon Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/685,884

(22) Filed: Aug. 24, 2017

(65) Prior Publication Data
US 2018/0151822 A1 May 31, 2018

(30) Foreign Application Priority Data
Nov. 28, 2016 (KR) .................. 10-2016-0159698

(51) Int. Cl.
*H01L 51/50* (2006.01)
*H01L 51/52* (2006.01)
*H01L 51/56* (2006.01)

(52) U.S. Cl.
CPC ...... *H01L 51/5036* (2013.01); *H01L 51/5203* (2013.01); *H01L 51/56* (2013.01); *H01L 2251/5361* (2013.01); *H01L 2251/564* (2013.01)

(58) Field of Classification Search
None
See application file for complete search history.

(56) References Cited

U.S. PATENT DOCUMENTS

| 9,577,209 B2* | 2/2017 | Tanada | H01L 27/3279 |
| 2007/0178710 A1* | 8/2007 | Muyres | B82Y 10/00 |
| | | | 438/778 |
| 2009/0009069 A1* | 1/2009 | Takata | H01L 27/3246 |
| | | | 313/504 |

(Continued)

FOREIGN PATENT DOCUMENTS

| CN | 101340754 A | 1/2009 |
| CN | 101442068 A | 5/2009 |

(Continued)

OTHER PUBLICATIONS

Extended European Search Report dated Apr. 5, 2018 in a European Application No. EP 17 20 4034.7.

(Continued)

*Primary Examiner* — Mounir S Amer
(74) *Attorney, Agent, or Firm* — Polsinelli PC

(57) ABSTRACT

A plurality of lighting apparatuses according to the present disclosure may be formed on a film having flexibility, and then cut to complete each unit lighting apparatus, and an lighting apparatus formed on the film may be provided with an aging pad to apply an aging voltage to the organic light emitting layer through the aging pad so as to age the lighting apparatus during the process of forming the lighting apparatus, and when the film formed with the lighting apparatus is cut and divided into individual lighting apparatuses, the aging pad may be removed and cut, and only a pad line for electrically connecting the aging pad to the first electrode and the second electrode may remain in the lighting apparatus.

12 Claims, 13 Drawing Sheets

(56) References Cited

U.S. PATENT DOCUMENTS

| | | | | |
|---|---|---|---|---|
| 2014/0183479 A1* | 7/2014 | Park | ..................... | H01L 51/56 |
| | | | | 257/40 |
| 2016/0315280 A1 | 10/2016 | Kizu et al. | | |
| 2017/0278912 A1* | 9/2017 | Kim | ................... | H01L 27/3246 |
| 2017/0323936 A1* | 11/2017 | Lee | .................... | H01L 27/3262 |

FOREIGN PATENT DOCUMENTS

| | | |
|---|---|---|
| CN | 102057513 A | 5/2011 |
| CN | 104425560 A | 3/2015 |
| CN | 104659235 A | 5/2015 |
| CN | 104885252 A | 9/2015 |
| CN | 105633297 A | 6/2016 |
| CN | 105917736 A | 8/2016 |
| JP | 2012-048934 A | 3/2012 |

OTHER PUBLICATIONS

Office Action dated Feb. 28, 2019 with English translation issued in the corresponding Chinese Patent Application No. 201711213961.0, pp. 1-16.

Office Action dated Jul. 3, 2019 issued in the corresponding Chinese Patent Application No. 201711213961.0 (20 pages).

* cited by examiner

LIGHTING APPARATUS USING ORGANIC LIGHT EMITTING DEVICE AND METHOD OF FABRICATING THEREOF

CROSS-REFERENCE TO RELATED APPLICATION

This application claims the benefit of Korean Patent Application No. 10-2016-0159698, filed on Nov. 28, 2016, which is hereby incorporated by reference in its entirety for all purposes as if fully set forth herein.

BACKGROUND

Field of the Disclosure

The present disclosure relates to a display device, and more particularly, to a lighting apparatus using an organic light emitting device with a simplified fabrication process, and a fabrication method thereof.

Description of the Background

In recent years, a fluorescent lamp or an incandescent lamp has been mainly used as a lighting apparatus. Among them, the incandescent lamp has a good color rendering index but has a low energy efficiency, and the fluorescent lamp has a good efficiency, but has a low color rendering index and contains mercury and thus has an environmental problem.

In order to solve such a problem of the conventional lighting apparatus, in recent years, a light emitting diode (LED) has been proposed as a lighting source for a lighting apparatus. The light emitting diode is composed of an inorganic light emitting material, and has the highest luminous efficiency in a blue wavelength band, but has a lower luminous efficiency as it goes toward a red and a green wavelength band, which is the color having the highest visual sensitivity. Therefore, there is a problem in that the luminous efficiency is reduced when white light with a combination of a red light emitting diode, a green light emitting diode, and a blue light emitting diode is emitted. Furthermore, since the width of each emission peak is narrow when a red light emitting diode, a green light emitting diode, and a blue light emitting diode are used, there is another problem in that the color rendering property deteriorates.

In order to solve such problems, a lighting apparatus for combining a blue light emitting diode with a yellow colored phosphor instead of combining a red light emitting diode, a green light emitting diode and a blue light emitting diode to output white light has been proposed. The reason why the light emitting diode having such a structure is proposed is that a method of using only a blue light emitting diode having a higher luminous efficiency and using a fluorescent material that receives blue light to emit yellow light for the remaining colors is more efficient than that of using a green light emitting diode having a low luminous efficiency.

However, even in case of a lighting apparatus of combining a blue light emitting diode with a yellow colored phosphor to output white light, the fluorescent material itself that emits yellow light has a poor luminous efficiency, and thus there is a limitation on enhancing the luminous efficiency of the lighting apparatus.

SUMMARY OF THE DISCLOSURE

The present disclosure is contrived to solve the aforementioned problem, and a feature of the present disclosure is to provide a lighting apparatus that can be fabricated by entirely depositing an organic light emitting layer on a substrate without using an open mask, and a fabrication method thereof.

Additional features and advantages of the present disclosure is to provide a lighting apparatus having an aging pad that is not covered by an organic light emitting layer during the entire deposition of the organic light emitting layer to age the organic light emitting through the aging pad, and a fabrication method thereof.

In order to accomplish the foregoing advantages, according to the present disclosure, an organic light emitting material and a metal may be entirely deposited on a substrate without using an open mask (metal mask) to form an organic light emitting device, thereby particularly allowing useful application to a roll fabrication apparatus.

A side surface of an organic light emitting layer may be exposed to the outside as the organic light emitting material is entirely deposited on the substrate, but a step structure such as a bank layer or a partition wall forming a step may be formed on an outer portion of the substrate, and thus the organic light emitting layer may be disposed at an upper portion of a first electrode and at an upper portion of the step structure during the deposition of the organic light emitting material. Accordingly, the organic light emitting layer disposed at an upper portion of the first electrode disposed on a lighting portion and the organic light emitting layer disposed on an upper surface of the step structure disposed on an outer portion may be disconnected from each other by a step of the step structure, thereby preventing moisture penetrated from the outside from being propagated to the organic light emitting layer of the lighting portion.

A first contact electrode and a second contact electrode may be formed on a contact portion of the substrate, and brought into contact with a first electrode and a second electrode through a first through hole and a second through hole, respectively, and a protective layer and a sealant may be provided on the organic light emitting device and adhered to a metal foil by an adhesive.

A plurality of lighting apparatuses may be formed on a film having flexibility, and then cut to complete each unit lighting apparatus, and an lighting apparatus formed on the film may be provided with an aging pad to apply an aging voltage to the organic light emitting layer through the aging pad so as to age the lighting apparatus during the process of forming the lighting apparatus.

When an organic light emitting material and a metal are entirely deposited on the substrate (film) using a roll fabrication apparatus to form an organic light emitting layer and a second electrode, a shielding portion for blocking an aging pad region may be provided in the fabrication apparatus, and exposed to the outside without depositing the organic light emitting material and the metal on the aging pad during the entire deposition.

When the film formed with the lighting apparatus is cut and divided into individual lighting apparatuses, the aging pad may be removed and cut, and only a pad line for electrically connecting the aging pad to the first electrode and the second electrode may remain in the lighting apparatus.

According to the present disclosure, an organic light emitting layer on the lighting portion and an organic light emitting layer in the outer portion may be disconnected by a step structure such as a bank layer or a partition wall, thereby preventing moisture penetrated from an outside region of the organic light from being propagated to an organic light emitting layer of the lighting portion that actually emits light along the organic light emitting layer. In addition, according to the present disclosure, the organic light emitting layer may be disconnected due to the structural characteristics of the bank layer, and thus an additional fabrication process may not be required, and as a result, it may be possible to prevent the addition of a fabrication process and resultant cost increase.

Moreover, according to the present disclosure, a bank layer may be provided on the lighting apparatus to deposit an organic light emitting material on an entire surface of the substrate, and thus the organic light emitting layer may be disconnected by the bank layer even when a side surface of the organic light emitting layer is exposed to the outside, thereby preventing moisture from infiltrating into the lighting portion through the exposed organic light emitting layer. Therefore, when the lighting apparatus according to the present disclosure is fabricated, an open mask for forming an organic light emitting layer only in a predetermined region within the substrate may not be required to block moisture propagation, thereby simplifying the fabrication process of the lighting apparatus, and allowing easy application to a roll fabrication process.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Hereinafter, the present disclosure will be described in detail with reference to the accompanying drawings.

The present disclosure provides a lighting apparatus including an organic light emitting device made of an organic material rather than a lighting apparatus including an inorganic light emitting device made of an inorganic material.

An organic light emitting device made of an organic light emitting material has a relatively good luminous efficiency in green and red colors as compared with an inorganic light emitting device. In addition, an organic light emitting device has a relatively large width in blue, red and green emission peaks as compared with an inorganic light emitting device, and thus it has an advantage in that the color rendering property thereof is improved and the light of the light emitting apparatus is more similar to the sunlight.

Figure 1:
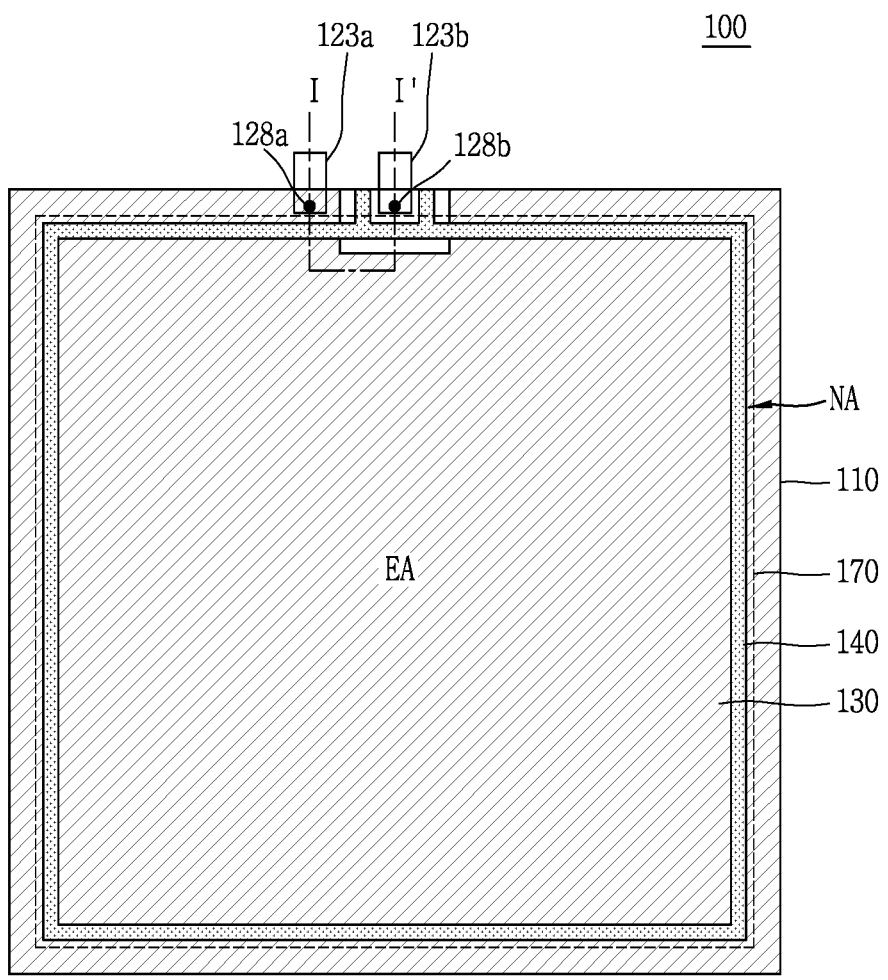
FIG. 1 is a plan view of a lighting apparatus according to a first aspect of the present disclosure.

FIG. 1 is a plan view illustrating the structure of a lighting apparatus using an organic light emitting device according to an aspect of the present disclosure.

As illustrated in FIG. 1, a lighting apparatus 100 according to the present disclosure is a surface-emitting lighting apparatus including a lighting portion (EA) that emits light to output the light to the outside and a substrate 110. A first electrode and a second electrode (not shown) are disposed over the entire surface of the substrate 110, and an organic light emitting layer 130 is disposed between the first electrode and the second electrode to form an organic light emitting device. According to the lighting apparatus 100 having such a structure, as a signal is applied to the first electrode and the second electrode of the organic light emitting device, the organic light emitting layer 130 emits light to output light over the entire substrate 110.

The organic light emitting layer 130 is formed of an organic light emitting material that outputs white light. For example, the organic light emitting layer 130 may include a blue organic light emitting layer, a red organic light emitting layer and a green organic light emitting layer or may have a tandem structure including a blue light emitting layer and a yellow-green light emitting layer. However, the organic light emitting layer 130 of the present disclosure is not limited to the above structure, but various structures may be applied thereto.

In addition, the present disclosure may include an electron injection layer and a hole injection layer for injecting electrons and holes respectively into the organic light emitting layer 130 of the present disclosure, an electron transport layer and a hole transport layer for transporting the injected electrons and holes respectively to the organic light emitting layer, and a charge generation layer that generates charges such as electrons and holes.

A bank layer 140 (or partition wall) is formed at the outer circumference of the substrate 110. The bank layer 140 prevents moisture from infiltrating into the organic light emitting layer 130. In general, when a polymer constituting an organic light emitting material is combined with moisture, the light emitting property is rapidly deteriorated and reduces a luminescent efficiency of the organic light emitting layer 130. In particular, when a part of the organic light emitting layer 130 is exposed to the outside in the lighting apparatus, moisture is propagated into the entire lighting apparatus 100 along the organic light emitting layer 130 to reduce a light emitting efficiency of the lighting apparatus 100.

According to the present disclosure, the bank layer 140 (or partition wall) is disposed on the entire outer circumference of the substrate 110 to prevent water from infiltrating into the organic light emitting layer 130 on the lighting portion of the lighting apparatus 100 that actually emits light. Though not shown in the drawing, a plurality of the bank layers 140 are arranged with a predetermined width, and the organic light emitting layer 130 is disposed on the first electrode and the bank layer 140. Since the plurality of bank layers 140 are formed to have a small width and a height of about 1 µm, a plurality of abrupt steps may be generated by the bank layer 140, and the light emitting layer 130 may be disconnected along the outer circumference of the substrate 110 by such steps, thereby preventing moisture from being propagated to the lighting portion.

As described above, according to the present disclosure, the bank layer 140 having a step is formed along the outer circumference of the substrate 110, and the organic light-emitting layer 130 is disconnected according to the structural characteristics of the bank layer 140 to prevent the propagation and infiltration of moisture, and thus an additional process or mask for disconnecting the organic light emitting layer 130 may not be required.

A first contact electrode 128*a* and a second contact electrode 12*ba* are disposed on one side of the outer circumference of the substrate 110. The first contact electrode 128*a* and the second contact electrode 128*b* connect a first electrode and a second electrode, respectively, to the outside to apply a voltage to the first electrode and the second electrode. The first contact electrode 128*a* and the second contact electrode 128*b* may be arranged one by one in an upper outer region of the substrate 110 on the drawing, but a plurality of the first contact electrodes 128*a* and the second contact electrodes 128*b* may be arranged. For example, the first contact electrode 128*a* and the second contact electrode 128*b* may be disposed one by one on an upper and a lower side of the substrate 110, respectively.

A first pad line 123*a* and a second pad line 123*b* electrically connected to the first electrode and the second electrode, respectively, are disposed on one side of an outer circumference of the substrate 110. Though not illustrated in the drawing, the first pad line 123*a* and the second pad line 123*b* are connected to a first aging pad and a second aging pad, respectively, and the first electrode and the second electrode are electrically connected to the first aging pad and the second aging pad, respectively.

An organic light emitting material used as the organic light emitting layer 130 may have a short lifespan, and vulnerability to moisture or oxygen, and may cause damage to a device when a high voltage or a high current is applied. In addition, since interface characteristics between the electrode and the organic light emitting layer 130 may not be so good, the characteristics of the device may be unstable, and therefore, there is a problem that the performance of the device can be stabilized only when the completed lighting apparatus is used for a long period of time. Moreover, when the first electrode and the second electrode are formed, impurities may be deposited into the organic light emitting layer 130 to lower the light emitting property and color quality of an organic material. In order to solve this problem, a high aging voltage can be applied to the organic light emitting layer 130 to age the organic light emitting layer 130 in a short period of time. At this time, the aging voltage may be a high voltage which is higher than a voltage applied to the first electrode and the second electrode of the lighting apparatus 100 or a reverse voltage of a voltage applied to the first electrode and the second electrode.

Aging may be carried out by applying an aging voltage through the first electrode and the second electrode, and the aging voltage may be applied subsequent to the fabrication process of the lighting apparatus 100, but may be also applied during the process for the efficiency of the process. In other words, subsequent to forming the organic light emitting layer 130 and the second electrode, aging can be carried out by applying an aging voltage in a state that the external terminals are brought into contact with the first and the second aging pads.

The aging voltage (i.e., reverse voltage) is applied through the aging pad. Though not illustrated in the drawing, the aging pad is connected to the first pad line 123*a* and the second pad line 123*b* and an aging voltage is applied to the first electrode and the second electrode through the first pad line 123*a* and the second pad line 123*b*.

Since the aging pad is used only to apply an aging voltage, the aging pad is removed after the aging voltage is applied during the process, and therefore, the aging pad does not remain in the completed lighting apparatus 100. However, when the aging pad is removed, the first pad line 123*a* and the second pad line 123*b* are not completely removed, and as illustrated in the drawing, a part of the first pad line 123*a* and the second pad line 123*b* may remain in the completed lighting apparatus 100.

Meanwhile, the lighting apparatus 100 according to the present disclosure may use a flexible substrate 110 such as a plastic film, and the following advantages may be obtained using a flexible substrate.

First, it may be possible to fabricate a flexible lighting apparatus 100 using the flexible substrate 110.

Secondly, it may be possible to fabricate the lighting apparatus 100 with a roll fabrication apparatus using the flexible substrate 110, thereby speeding up the fabrication process and reducing the fabrication cost.

When a non-flexible substrate such as glass is used, the substrate should be transferred with a separate transfer device between the processes. However, when the flexible substrate 110 is used as in the present disclosure, the processes may be carried out in a state that a plurality of rolls are provided and the substrate 110 is wound around the rolls, and then the rolls are driven to transfer the substrate 110 between the rolls, thereby speeding up the process as well as reducing an area of the plant where the process line is installed.

Figure 2:
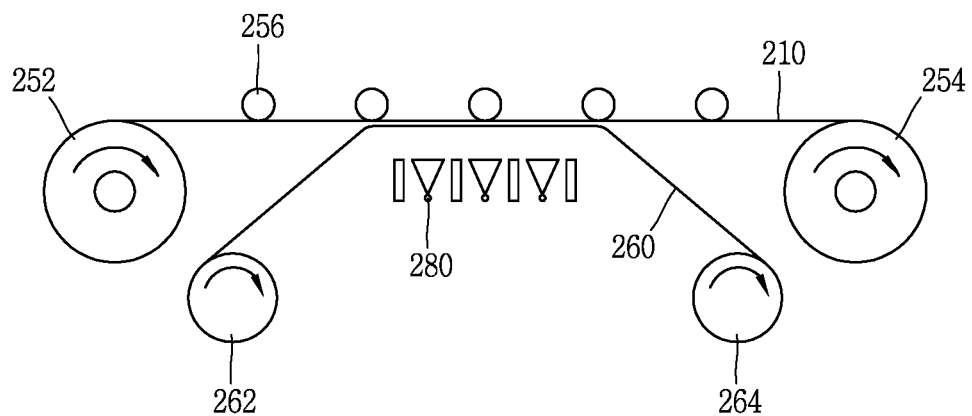
FIG. 2 is a view illustrating the concept of a roll fabrication apparatus.

FIG. 2 is a schematic view illustrating the concept of a typical roll fabrication apparatus for fabricating a flexible lighting apparatus using a flexible substrate 110.

As illustrated in FIG. 2, a typical roll fabrication apparatus includes a film supply roll 252 configured to supply a substrate, namely, a plastic film 210 having a flexibility, a film collection roll 254 configured to collect the plastic film 210, a guide roll 256 configured to guide the plastic film 210, a mask supply roll 262 configured to supply an open mask 260 (or metal mask), a mask collection roll 262 configured to collect the open mask 260, and a deposition unit 280 configured to deposit an organic material or a metal to form a layer.

According to a roll fabrication apparatus having the foregoing configuration, the plastic film 210 used as the substrate 110 of the lighting apparatus 100 is transferred from the film supply roll 252 to the deposition unit 280 while at the same the open mask 260 is transferred from the mask supply roll 262 to the deposition unit 280, and thus the deposition unit 280 deposits an organic material or metal in a partial region of the plastic film in a state that the open mask 260 is disposed on an entire surface of the plastic film 210.

The open mask 260 for which deposition is completed is separated from the plastic film 210, and the plastic film 210 is collected by the film collection roll 254, and the open mask 260 is collected by the mask collection roll 262.

When a roll fabrication apparatus having the foregoing structure is used, the plastic film 210 may be continuously supplied by the film supply roll 252 to continuously perform the process, thereby allowing a rapid fabrication of the lighting apparatus in an in-line process.

Figure 3A:
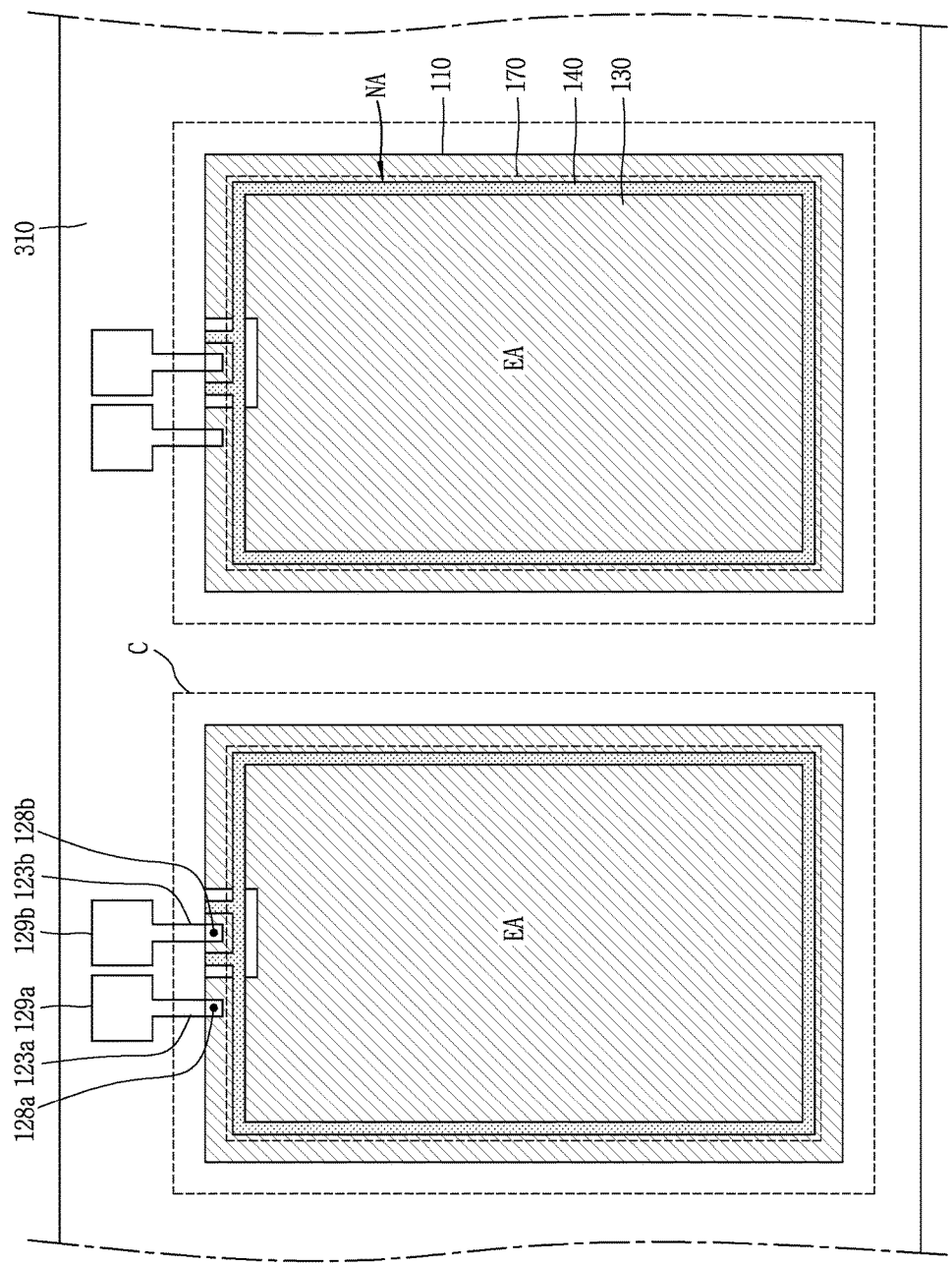
FIGS. 3A and 3B are plan views illustrating a flexible film formed with lighting apparatuses.
Figure 3B:
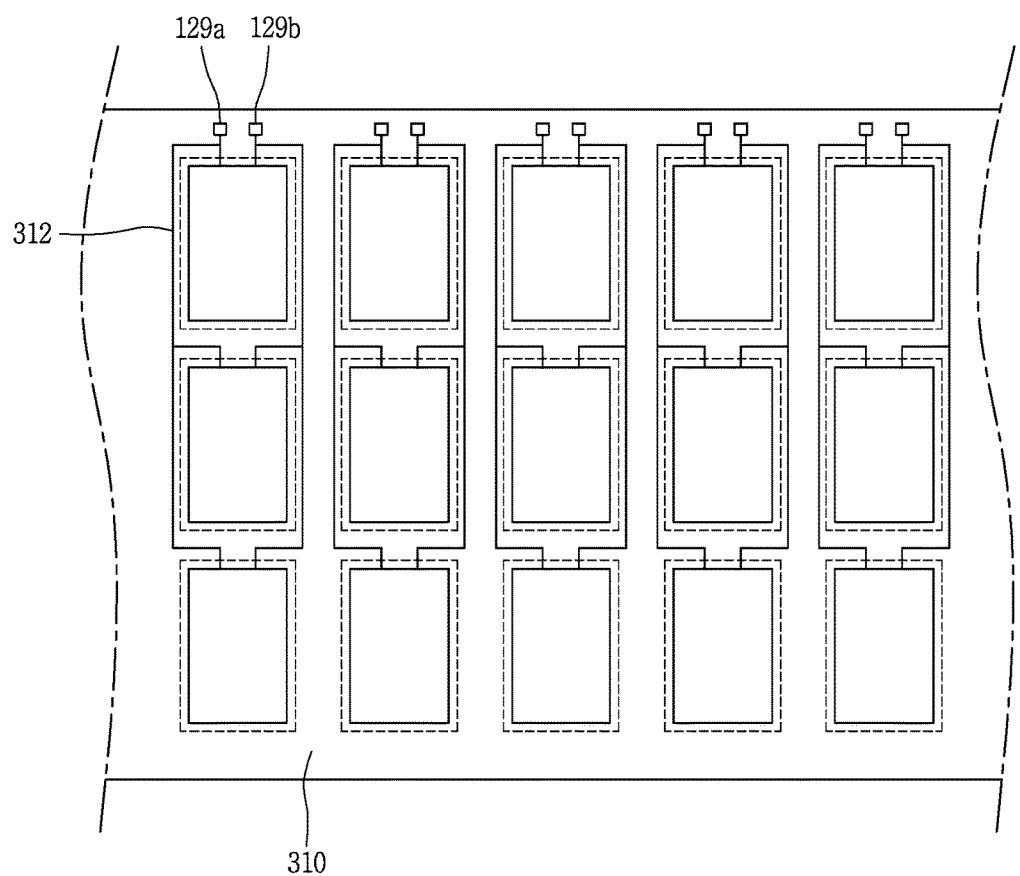

FIGS. 3A and 3B are plan views illustrating a film 310 formed of a flexible plastic used in a roll fabrication apparatus.

As illustrated in FIG. 3A, the flexible film 310 is a mother board on which a plurality of lighting apparatuses 100 are arranged. A width of the film 310 is formed to be slightly larger than that of the lighting apparatus 100 to be fabricated, and a plurality of the lighting apparatuses 100 are formed in a line on the film 310. A first contact electrode 128a and a second contact electrode 128b are disposed above an outer region of the lighting apparatus 100, and a first aging pad 129a and a second aging pad 128b are provided at an outside of the lighting apparatus 100. The first aging pad 129a and the second aging pad 129b are electrically connected to the first electrode and the second electrode through the first pad line 123a and the second pad line 123b, respectively.

As the film 310 is wound around the film supply roll 252 of the roll fabrication apparatus illustrated in FIG. 2 and the film supply roll 252 and the film collection roll 254 are driven, the process is carried out while being transferred in real time between the film supply roll 252 and the film collection roll 254. At this time, all the processes of the lighting apparatus 100 may be carried out in the roll fabrication apparatus or only some processes such as the organic light emitting layer, the second electrode, and the sealant may be carried out.

When the lighting apparatus 100 is completed by the roll fabrication process, the film 310 is cut along a cutting line (C) and a plurality of lighting apparatuses 100 formed on the film 310 are divided into unit lighting apparatuses. At this time, the cutting line (C) is formed in an area spaced apart from an edge of the lighting apparatus 100 formed on the film 310 at a preset interval and an area between the lighting apparatus 100 and the lighting apparatus 100. More specifically, the cutting line (C) is formed across the first pad line 123a and the second pad line 123b between the lighting apparatus 100 and the first aging pad 129a and the second aging pad 129b. Accordingly, when the film 310 is cut, the first aging pad 129a and the second aging pad 129b are cut and removed, and only a part of the cut first pad line 123a and second aging pad 129b are connected to the first electrode and the second electrode, respectively, on the completed lighting apparatus 100.

As illustrated in FIG. 3B, a plurality of lighting apparatuses 100 may be formed in a width direction of the film 310 on the flexible film 310. In other words, on the film 310 having the foregoing structure, a plurality of lighting apparatuses 100 may be formed in n×m matrix shapes. Event at this time, the first and the second aging pad 129a,129b are provided in each lighting apparatus 100 such that the first and the second electrode of the lighting apparatus 100 arranged in a first column are electrically connected to the first aging pad 129a and the second aging pad 129b through the first pad line 123a and the second pad line 123b, respectively.

Since the first aging pad 129a and the second aging pad 129b are disposed only in an edge region of the film 310, the lighting apparatus 100 subsequent to the first column is not directly connected to the first aging pad 129a and the second aging pad 129b through the first pad line 123a and the second pad line 123b. However, a metal line 312 is formed on the film 310 to electrically connect the first pad line 123a and the second pad line 123b of the lighting apparatus 100 subsequent to the first column to the first aging pad 129a and the second aging pad 129b through the metal line 312.

However, the following problems arise in a roll fabrication apparatus for fabricating a lighting apparatus on a film as described above.

The roll fabrication apparatus may be used to form various metal patterns, but in particular, it may be useful when forming the organic light emitting layer 130, the second electrode, or the like, because the organic light emitting layer 130 or the second electrode is not patterned on the substrate 110 by a photolithography process but entirely deposited over the entire area of the substrate 110, and thus easily formed by a roll fabrication process.

However, when the organic light emitting material is entirely deposited on the substrate 110 by the roll fabrication apparatus to form the organic light emitting layer 130, a lateral surface of the entirely deposited organic light emitting layer 130 is formed at the same level as that of the substrate, and thus the organic light emitting layer 130 is exposed to the outside through the lateral surface of the lighting apparatus 100. The organic light emitting material is vulnerable to moisture, and when it is combined with moisture, not only rapidly deteriorates but also easily propagates moisture. Therefore, in order to prevent the lighting apparatus 100 from being defective due to moisture propagated through the organic light emitting layer 130 exposed to the outside, the organic light emitting layer 130 should not be exposed to the outside during fabrication of the lighting apparatus 100.

An open mask 260 may block an outer region of the substrate 110 to prevent the organic light emitting layer 130 from being deposited on the outer region of the substrate 110 when the organic light emitting material is deposited, and a lateral surface of the organic light emitting layer 130 may be sealed by sealing the outer region with a sealant, thereby preventing the organic light emitting layer 130 from being exposed to the outside.

However, as illustrated in FIG. 2, when the organic light emitting layer 130 is formed using the open mask 260, a system for supplying the plastic film 210 (for example, a supply roll, a guide roll, a collection roll, etc.) and a system for supplying the open mask 260 should be in-lined, there is a disadvantage in that a length of the process line is long and a length of the open mask 260 is also long. In addition, there is a difficulty in that not only the plastic film 210 and the open mask 260 should be supplied in a synchronized manner, but also they should be aligned in a continuous process. Moreover, the used open mask 260 should be cleaned, and thus there is a difficulty in cleaning the open mask 260 which is long.

In other words, it is required to use a roll process using an open mask in order to rapidly fabricate the lighting apparatus 100, but there is a difficulty in fabricating the lighting apparatus 100 using an actual roll fabrication apparatus due to the use of such an open mask.

However, according to the present disclosure, a bank layer 140 may be provided in the lighting apparatus 100 to entirely deposit an organic light emitting material over the entire area of the substrate 110, and even when a lateral surface of the organic light emitting layer 130 is exposed to the outside, the organic light emitting layer 130 may be disconnected by the bank layer 140, thereby preventing from being infiltrated through the exposed organic light emitting layer 130. Therefore, when the lighting apparatus 100 according to the present disclosure is fabricated, the open mask may not be required, and thus the fabrication process of the lighting apparatus 100 may be simplified and easily applicable to the roll fabrication process.

On the other hand, as illustrated in FIGS. 3A and 3B, a first aging pad 129a and a second aging pad 129b, which are connected to the lighting apparatus 100 as well as the lighting apparatus 100 may be provided on the film 310 to form the first pad line 123a and the second pad line 123b, and when an organic light emitting material is entirely deposited over the entire area of the substrate 110, the first aging pad 129a and the second aging pad 129b may be covered by the organic light emitting material, and thus an aging voltage may not be applied to the first aging pad 129a and the second aging pad 129b by coming into contact with an external terminal.

In order to solve such a problem, according to the present disclosure, the first aging pad 129a and the second aging pad 129b connected to the lighting apparatus 100 are exposed to the outside, and an aging voltage is applied to the first aging pad 129a and the second aging pad 129b to age the organic light emitting layer. Furthermore, in case of the film 310 having a structure illustrated in FIG. 3B, the first aging pad 129a and the second aging pad 129b connected to the lighting apparatus 100 in a first column are exposed to the outside, and the first aging pad 129a and the second aging pad 129b of the light emitting device 100 in the first column are connected to the first aging pad 129a and the second aging pad 129b of the lighting apparatus 100 subsequent to the second column through the metal line 312 disposed on the film 310 to apply an voltage to the exposed first aging pad 129a and second aging pad 129b, thereby applying the aging voltage to all lighting apparatuses 100 formed on the film 310.

Figure 4:
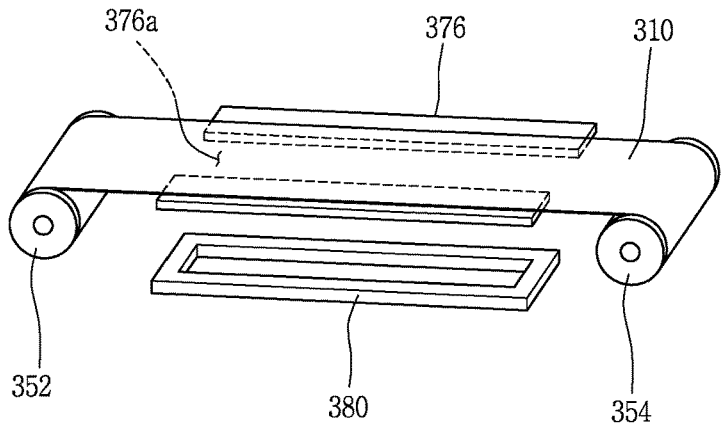
FIG. 4 is a schematic view illustrating a roll fabrication apparatus provided with a shielding portion.
Figure 5:
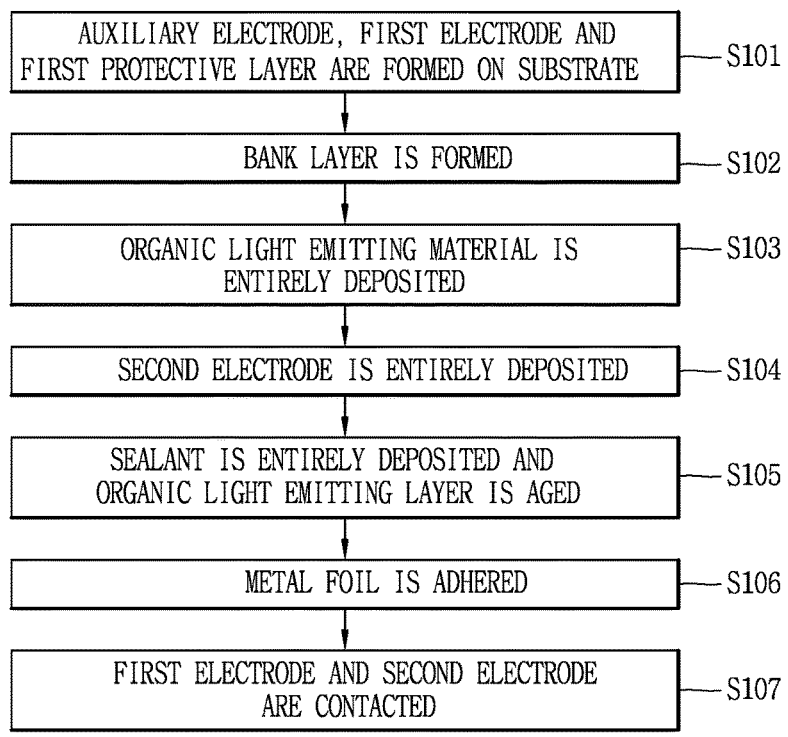
FIG. 5 is a view schematically illustrating a fabrication method of a lighting apparatus according to the present disclosure.
Figure 6:
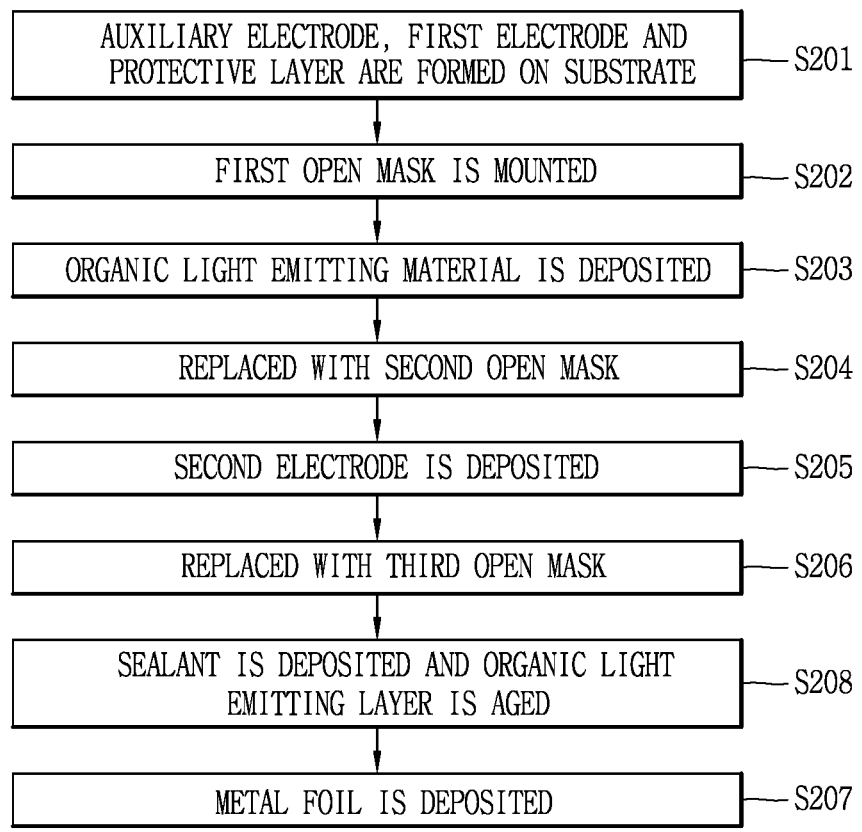
FIG. 6 is a view schematically illustrating a fabrication method of a lighting apparatus having a structure without a bank layer.

FIG. 4 is a schematic view illustrating the structure of a roll fabrication apparatus according to the present disclosure for depositing an organic material in a state that the first aging pad 129a and the second aging pad 129b are exposed to the outside.

As illustrated in FIG. 4, the roll fabrication apparatus according to the present disclosure may include a film supply roll 352 configured to supply a flexible plastic film 310, a film collection roll 354 configured to collect the film 310, and a deposition portion 380 configured to deposit an organic substance or metal to form a layer. At this time, though not shown in the drawing, the roll fabrication application may be provided with a plurality of guide rolls configured to guide the conveyance of the film 310.

Contrary to a typical roll fabrication apparatus illustrated in FIG. 2, in the roll fabrication apparatus according to the present disclosure, the open mask supply roll configured to supply an open mask and the open mask collection roll configured to collect the open mask are not required, thereby simplifying the fabrication apparatus and minimizing a space occupied by the facility as compared as the typical roll fabrication apparatus.

Meanwhile, in a roll fabrication apparatus according to the present disclosure, a shielding portion 376 is provided between the film 310 and the deposition portion 380. The shielding portion 376 covers an edge region of the film 310 illustrated in FIG. 3A, for example, not to deposit an organic material or metal in this region. The first aging pad 129a and the second aging pad 129b are disposed in an edge region of the film 310 having a preset length, and when an organic material is deposited in this region, the first aging pad 129a and the second aging pad 129b are covered by the organic material, and thus an external terminal cannot make electrical contact with the first aging pad 129a and the second aging pad 129. Therefore, it may be impossible to age the organic light emitting layer.

Of course, like a roll fabrication apparatus having a typical structure illustrated in FIG. 2, when an open mask is disposed on the film 310, an organic material is deposited only in a part of the region in which the lighting apparatus is to be formed, but the organic material is not deposited in a region in which the first aging pad 129a and the second aging pad 129b are formed, and there is no problem in applying an aging voltage.

However, according to a roll fabrication apparatus of the present disclosure, an open mask is not used, and thus a problem arises. The shielding portion 376 solves such a problem. In other words, when an organic material is deposited, the shielding portion 376 covers only an edge region of the film 310 in which the first aging pad 129a and the second aging pad 129b are formed, and thus the organic material is not deposited on the first aging pad 129a and the second aging pad 129b.

As described above, the shielding portion 376 of the roll fabrication apparatus according to the present disclosure performs a function similar to that of the open mask. However, the shielding portion 376 of the roll fabrication apparatus of the present disclosure has following differences from the open mask of a typical roll fabrication apparatus.

Typically, the open mask blocks a part of the lighting apparatus to deposit an organic material or metal only in a predetermined area within the lighting apparatus. In other words, the open mask patterns the organic material or metal within the lighting apparatus.

On the contrary, the shielding portion 376 of the roll fabrication apparatus according to the present disclosure does not block an organic material deposited in a region in which the lighting apparatus is formed, but blocks an organic material deposited in an outer region of the lighting apparatus. Thus, the open mask includes an open area corresponding to each of a plurality of lighting apparatuses formed on the film 310, whereas the shielding portion 376 of the present disclosure merely blocks only an edge area of the film.

Therefore, a typical open mask is provided with a separate supply roll and a collection roll like the film, and the open mask wound around the supply roll and the collection roll is transferred to a deposition area in synchronization with the film, whereas the shielding part 376 of the present disclosure always blocks only an edge area of the film 310, and thus a separate mask corresponding to the structure of the lighting apparatus formed on the film 310 is not required. In other words, according to the roll fabrication apparatus of the present disclosure, a blocking means for blocking only a predetermined area at all times is required instead of the blocking means supplied in synchronization with the film 310.

As a result, according to the roll fabrication apparatus of the present disclosure, the shielding portion 376 is provided above the deposition portion 380 as a blocking means. The shielding portion 376 is a mechanism having an opening portion 376a with a predetermined width formed of a material such as metal, and fixedly provided at an upper portion of the deposition portion 380. When the film 310 is continuously deposited by the deposition portion 380 while being transferred between the supply roll 352 and the collection roll 354, a region in which the lighting apparatus of the film 310 is formed is exposed to the deposition portion 380 through an opening portion 376a of the shielding portion 376, and a vaporized organic material in the deposition portion 380 is deposited on the exposed region through the opening portion 376a.

As described above, the shielding portion 376 of the roll fabrication apparatus of the present disclosure may be fixedly provided on the deposition portion 380 as a part of the roll fabrication apparatus, and thus roll devices for supplying, transferring and collecting an open mask, a cleaning device for cleaning the used open mask, and the like as in a typical roll fabrication apparatus may not be required, thereby greatly simplifying the fabrication facility.

On the other hand, the shielding portion 376 may block only both edges (both sides) of the film 310, and therefore, when a plurality of columns of lighting apparatuses are formed on the film 310 as illustrated in FIG. 3B, the first aging pad 129a and the second aging pad 129b of the lighting apparatus formed within the film 310 (a central region rather than an edge region) may not be blocked by the shielding portion 376, and an organic light emitting layer may be formed on the first aging pad 129a and the second aging pad 129b of the lighting apparatus formed within the film 310, and as a result, electrical contact with an external terminal may not be allowed, and thus an aging voltage may not be applied to the relevant lighting apparatus.

However, in case of the foregoing structure, as illustrated in FIG. 3B, the first aging pad 129a and the second aging pad 129b disposed in an edge region of the film 310 and blocked by the shielding portion 376, namely, the first aging pad 129a and the second aging pad 129b of the lighting apparatus disposed in a first column of the film 310, may be connected to the first aging pad 129a and the second aging pad 129b of the lighting apparatus disposed at an inside of the film 310, namely, the lighting apparatus disposed in columns subsequent to a second column, and when an aging voltage is applied to the exposed first aging pad 129a and second aging pad 129b, the aging voltage may be applied to all the lighting apparatuses formed on the film 310.

Hereinafter, the detailed structure of a lighting device according to the present disclosure will be described with reference to the drawings.

Figure 7:
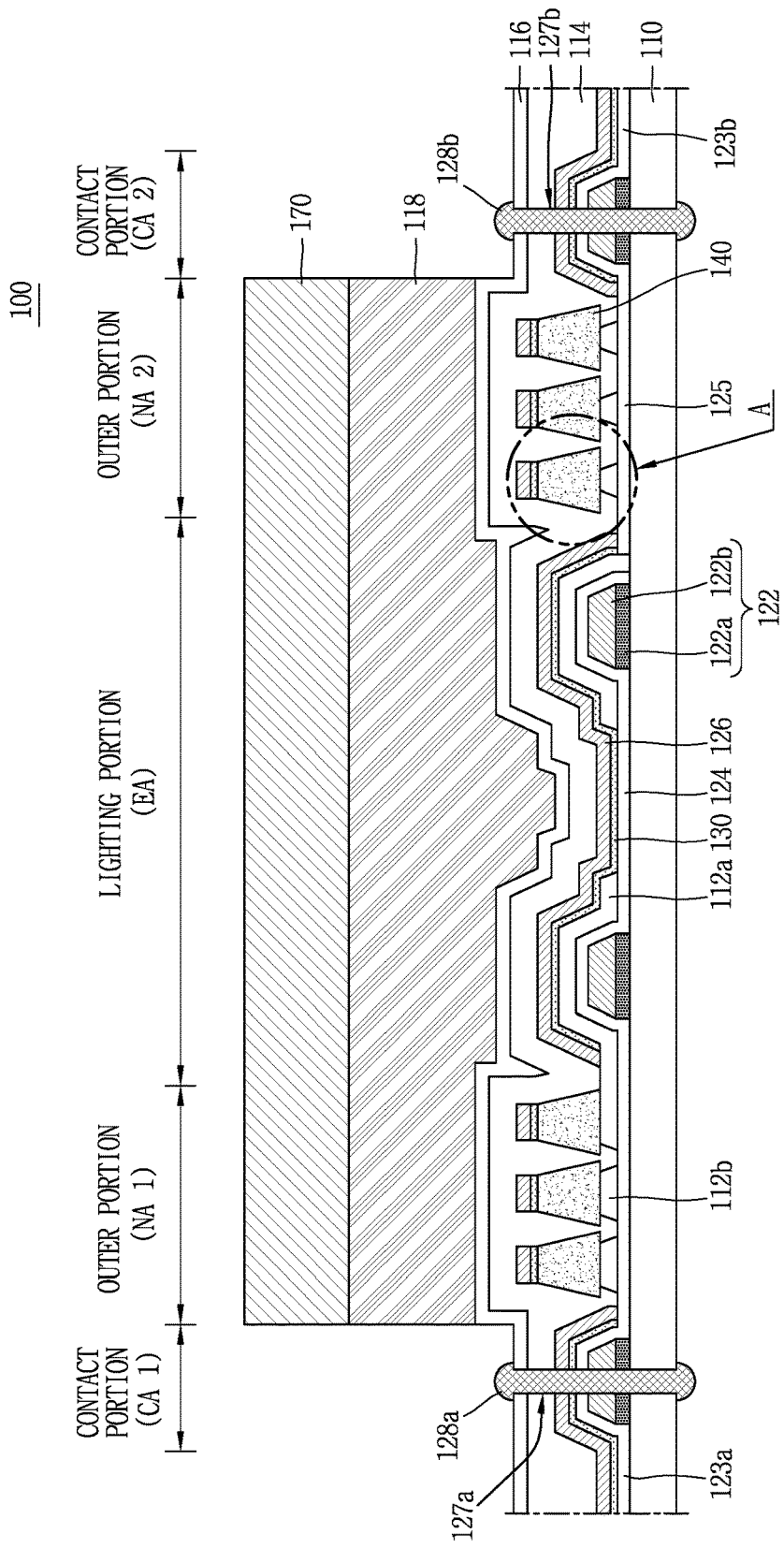
FIG. 7 is a cross-sectional view taken along line I-I' in FIG. 1.

FIG. 7 is a view illustrating a lighting apparatus according to a first aspect of the present disclosure, which is a cross-sectional view taken along line I-I' in FIG. 1. In the following description, the lighting apparatus of the present disclosure will be described as a flexible lighting apparatus having flexibility, but the present disclosure may be applicable not only to a flexible lighting apparatus of the present disclosure but also to a typical non-flexible lighting apparatus.

As illustrated in FIG. 7, the lighting apparatus 100 of the present aspect may include a lighting portion (EA) that emits light, outer portions (NA1, NA2) arranged along the outer circumference of the lighting portion (EA), and contact portions (CA1, CA2) for electrically connecting an electrode disposed on the lighting portion (EA) to the outside to apply a signal to the lighting portion (EA).

A first electrode 124 is disposed on a substrate 110 made of a transparent material. For the substrate 110, a solid material such as glass may be used, but a material having flexibility such as plastic may also be used, thereby allowing the fabrication of the lighting apparatus 100 having flexibility. Furthermore, according to the present disclosure, a material having flexibility may be used for the substrate 110, it may be possible to perform roll-to-roll processes using a roll, thereby allowing a rapid fabrication of the lighting apparatus 100.

The first electrode 124 is formed on the lighting portion (EA), the first outer portion (NA1) and the first contact portion (CA1), and formed of a transparent conductive material having a good conductivity and a high work function. For example, according to the present disclosure, the first electrode 124 may be formed of indium tin oxide (ITO), indium zinc oxide (IZO), a tin oxide based and a zinc oxide based transparent conductive material or the like, and a transparent conductive polymer may also be used for the first electrode 124.

Furthermore, a connection pattern 125 is disposed on the substrate 110 of the second outer portion (NA2). The connection pattern 125 may be separately formed from the first electrode 124, but may also be formed of the same material by the same process.

Furthermore, a first pad line 123a and a second pad line 123b are disposed on the first and the second contact portions (CA1, CA2) of the substrate 110, respectively. The first and second pad lines 123a and 123b are formed of the same material by the same process as the first electrode 124, and connected to the first and the second aging pad which are not shown in the drawing, thereby electrically connecting the first electrode 124 and the second electrode 126 to the first aging pad and the second aging pad.

An auxiliary electrode 122 is disposed on the lighting portion (EA) and the contact portions (CA1, CA2) of the substrate 110 and electrically connected to the first electrode 124. The first electrode 124 has an advantage in that it is formed of a transparent conductive material to transmit light emitted therefrom, but also has a disadvantage in that an electrical resistance thereof is much higher than that of a metal. Accordingly, when the large-area lighting apparatus 100 is fabricated, the distribution of voltages applied to a wide lighting area becomes non-uniform due to a large resistance of the transparent conductive material, and such a non-uniform voltage distribution does not allow light emission having a uniform luminance on the large-area lighting apparatus 100.

The auxiliary electrode 122 is disposed in a matrix shape with a small width, a mesh shape, a hexagonal shape, an octagonal shape, a circular shape, or the like over the entire lighting portion (EA) to uniformly apply a voltage to the first electrode 124 of the entire lighting apparatus 100, thereby allowing light emission having a uniform luminance on the large-area lighting apparatus 100.

On the drawing, the auxiliary electrode 122 may be disposed below the first electrode 124, but the auxiliary electrode 122 may also be disposed on the first electrode 124. The auxiliary electrode 122 disposed on the contact portion (CA) may be used as a path for transferring a voltage to the first electrode 124, but also brought into contact with the outside to perform the role of a contact electrode for applying an external voltage to the first electrode 124.

The auxiliary electrode 122 is made of a metal having a good electrical conductivity such as Al, Au, Cu, Ti, W, Mo or an alloy thereof. On the drawing, the auxiliary electrode 122 may be formed with a double layer structure, but the auxiliary electrode 122 may also be formed with a single layer.

A first protective layer 112 is deposited on the lighting portion (EA) and the outer portions (NA1, NA2) of the substrate 110, and a plurality of bank layers 140 are disposed on the first protective layer 112b of the outer portions (NA1, NA). The first protective layer 112a disposed on the lighting portion (EA) is configured to cover the auxiliary electrode 122 and the first electrode 124 thereon, but the first protective layer 112a is not disposed in a light emitting region that actually emits light.

The first protective layer 112b disposed on the outer portions (NA1, NA2) is disposed below a plurality of bank layers 140 along the outer circumference of the substrate 110. Here, the first protective layer 112b is undercut below the bank layer 140, and thus the width of a lower surface of the bank layer 140 is greater than the width of an upper surface of the first protective layer 112b.

Furthermore, the first protective layer 112a of the lighting portion (EA) is formed to surround the auxiliary electrode 122 so as to reduce a stepped portion due to the auxiliary electrode 122, and thus various layers to be formed thereafter will be stably formed without being disconnected.

The first protective layer 112 is formed of an inorganic layer such as $SiO_x$ and $SiN_x$. However, the first protective layer 112 may also be formed of an organic layer such as photoacryl or a plurality of layers having an inorganic layer and an organic layer.

The bank layer 140 is formed of an organic insulating layer, and a cross-section thereof is formed in a tapered triangular shape. Since the width of a lower surface of the bank layer 140 is greater than the width of an upper surface of the first protective layer 112b, and a non-continuous side surface is formed between a lower surface and an upper surface of the first protective layer 112b in a boundary region between the bank layer 140 and the first protective layer 112b.

The organic light emitting layer 130 and the second electrode 126 are disposed on the first electrode 124 of the lighting portion (EA), on the bank layer 140 of the outer portions (NA1, NA2), and on the first electrode 124 of the contact portions (CA1, CA2). The organic light emitting layer 130 may be formed of a red light emitting layer, a blue light emitting layer, and a green light emitting layer or configured with a tandem structure including a blue light emitting layer and a yellow-green light emitting layer as a white organic light emitting layer. Furthermore, the organic light emitting layer 130 may include an electron injection layer and a hole injection layer for injecting electrons and holes respectively into the organic light emitting layer, an electron transport layer and a hole transport layer for transporting the injected electrons and holes respectively to the organic light emitting layer, and a charge generation layer that generates charges such as electrons and holes. The second electrode 126 may be formed of a metal such as Ca, Ba, Mg, Al and Ag.

The first electrode 124, the organic light emitting layer 130, and the second electrode 126 of the lighting portion (EA) form an organic light emitting device. When the first electrode 124 is an anode of an organic light emitting device and the second electrode 126 is a cathode thereof, and a voltage is applied to the first electrode 124 and the second electrode 126, electrons are injected from the second electrode 126 into the organic light emitting layer 130 and holes are injected from the first electrode 124 into the organic light emitting layer 130 to generate excitons within the organic light emitting layer 130, and as excitons decay, light corresponding to an energy difference between LUMO (Lowest Unoccupied Molecular Orbital) and HOMO (Highest Occupied Molecular Orbital) of the light emitting layer is generated and emitted in a downward direction (toward the substrate 110 on the drawing).

Since the first protective layer 112a is disposed on the auxiliary electrode 122 of the lighting portion (EA), the organic light emitting layer 130 on the auxiliary electrode 122 is not directly brought into contact with the first electrode 124, and thus an organic light emitting device is not formed on the electrode 122. In other words, the organic light emitting device within the lighting portion (EA) is formed only within the auxiliary electrode 122 formed in a matrix shape, for example.

The organic light emitting layer 130 disposed within the lighting portion (EA) is disposed on the first electrode 124 and the first protective layer 112a while the organic light emitting layer 130 disposed on the outer portions (NA1, NA2) is disposed on an upper surface of bank layer 140. The bank layer 140 is formed with a thickness of about 1 μm to generate a step by the bank layer 140, and the organic light emitting layer 130 within the lighting portion (EA) and the organic light emitting layer 130 of the outer portions (NA1, NA2) are disconnected by the step.

Figure 8:
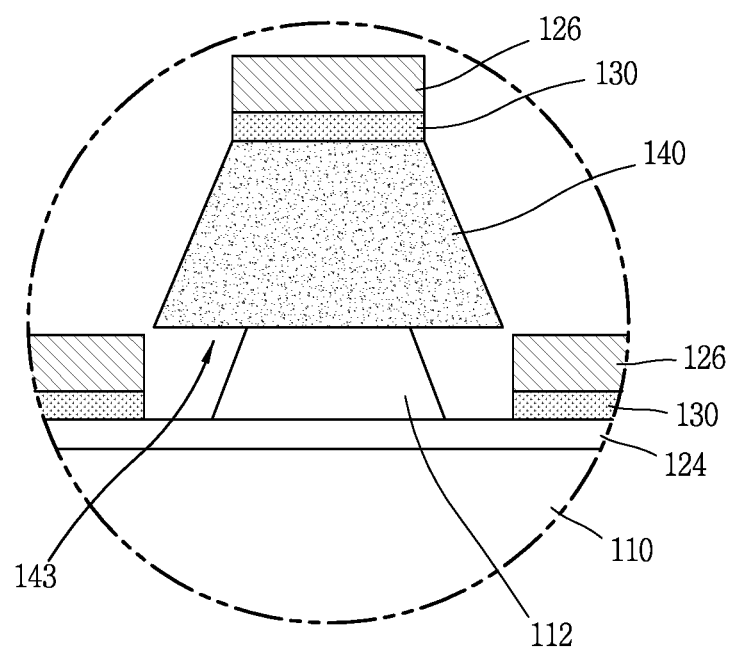
FIG. 8 is an enlarged view illustrating region A in FIG. 7.

FIG. 8 as an enlarged view illustrating region A in FIG. 7 is a view illustrating a disconnection between the organic light emitting layer 130 within the lighting portion (EA) and the organic light emitting layer 130 of the outer portions (NA1, NA2).

As illustrated in FIG. 3, the bank layer 140 is formed with a height of 1 μm and tapered at a predetermined angle, and thus a large step is formed between an upper surface of the first electrode 124 and an upper surface of the bank layer 140. Furthermore, the first protective layer 112b is undercut at a lower surface of the bank layer 140, and thus a discontinuous region 143 due to the undercut is formed between a lower surface of the bank layer 140 and an upper surface of the first protective layer 112b. Accordingly, when an organic light emitting material is deposited over the entire substrate 110, the organic light emitting layer 130 is not formed on a side surface of the bank layer 140, and the organic light emitting layer 130 within the lighting portion (EA) and the organic light emitting layer 130 of the outer portions (NA1, NA2) are disconnected from each other. Even when the organic light emitting layer 130 is formed on a side surface of the bank layer 140, the organic light emitting layer 130 within the lighting portion (EA) and the organic light emitting layer 130 of the outer portions (NA1, NA2) are disconnected by a discontinuous region 143 between the bank layer 130 and the first protective layer 112b.

As described above, according to the present disclosure, as the organic light emitting layer 130 within the lighting portion (EA) and the organic light emitting layer 130 of the outer portions (NA1, NA2) are disconnected by the bank layer 140, it may be possible to prevent moisture penetrated from an external region of the organic light emitting layer 130 from being propagated to the organic light emitting layer 130 of the lighting portion (EA) that actually emits light along the organic light emitting layer 130. Moreover, according to the present disclosure, the organic light emitting layer 130 may be disconnected due to the structural characteristics of the bank layer 140, and thus and additional fabrication process may not be required, and as a result, it may be possible to prevent the addition of a fabrication process and resultant cost increase.

The second electrode 126 is also disposed on the organic light emitting layer 130 of the lighting portion (EA) and on the bank layer 140 of the outer portions (NA1, NA2), and thus the second electrode 126 of the lighting portion (EA) is disconnected from the second electrode 126 of the second outer portion (NA2). Therefore, a voltage cannot be applied to the second electrode 126 of the lighting portion (EA) through the second contact portion (CA2). In order to prevent the disconnection, according to the present disclosure, the second electrode 126 of the lighting portion (EA) is electrically connected to the second electrode 126 of the second outer portion (NA2) by a connection pattern 125 disposed on the second contact portion (CA2).

On the other hand, though the bank layer 140 is formed in a shape having a lager bottom width and a smaller top width, the bank layer 140 of the present disclosure is not limited to such a shape. The bank layer 140 of the present disclosure is to prevent moisture from being propagated from the outside through the organic light emitting layer 130 by disconnecting the entirely deposited organic light emitting layer 130, and thus any shape may be used as long as it accomplishes the foregoing objective. In other words, when the organic light emitting layer 130 disposed on the bank layer 140 and the organic light emitting layer 130 disposed below the first electrode 124 are disconnected by increasing a step difference due to the bank layer 140, any shape may be used. For example, the bank layer 140 may be formed in a shape having a smaller bottom width and a larger top width.

A second protective layer 114 and a sealant 116 are provided on the substrate 110 formed with the bank layer 140. The second protective layer 114 may be formed of an organic layer such as photoacryl or an inorganic layer such as $SiO_x$ or $SiN_x$. In addition, the protective layer 114 may be composed of a plurality of layers having an organic layer and an inorganic layer.

The sealant 116 encapsulates the organic light emitting device to protect the organic light emitting device from external moisture or heat. For the sealant 116, an epoxy compound, an acrylate compound, an acrylic compound or the like may be used.

Instead of forming both the second protective layer 114 and the sealant 116, only one of the second protective layer 114 and the sealant 116 may be formed.

The substrate 110, the first electrode 124, the organic light emitting layer 130, the second electrode 126, the second protective layer 114 and the sealant 116 of the contact portions (CA1, CA2) are formed with a first through hole 127a and a second through hole 127b, respectively, and a first contact electrode 128a and a second contact electrode 128b are formed on the first through hole 127a and the second through hole 127b, respectively. The first contact electrode 128a and the second contact electrode 128b are electrically connected to an external voltage source to apply a voltage to the first electrode 124 and the second electrode 126, respectively. For the first contact electrode 128a and the second contact electrode 128b, Ag may be used.

On the drawing, the substrate 110, the first electrode 124, the organic light emitting layer 130, the second electrode 126, the second protective layer 114, and the sealant 116 of the contact portions (CA1, CA2) are formed with through holes, but contact holes other than the through holes may be formed in such a manner that the first contact electrode 128a and the second contact electrode 128b are formed within the contact hole, thereby allowing the first contact electrode 128a and the second contact electrode 128b to be electrically connected to an external voltage source. In this case, the contact hole of the first contact portion (CA1) is formed on the organic light emitting layer 130, the second electrode 126, the second protective layer 114 and the sealant 116 on the first electrode 124 to connect the first contact electrode 128a to the first electrode 124, and the contact hole of the second contact portion (CA2) is formed on the second protective layer 114 and the sealant 116 on the second electrode 126 to connect the second contact electrode 128b to the second electrode 126.

An adhesive 118 is applied onto the sealant 116 and a metal foil 170 is disposed thereon to adhere the metal foil 170 to the sealant 116, thereby sealing the lighting apparatus 100. The adhesive 118 may be a photocuring adhesive or a thermosetting adhesive.

As described above, according to the present disclosure, the organic light emitting layer 130 is deposited over the entire substrate 110, and the organic light emitting layer 130 is disconnected due to the structural characteristics of the bank layer 140, thereby preventing moisture from being penetrated and propagated into the organic light emitting layer 130.

Moreover, according to the present disclosure, the substrate 110 formed of a plastic film having flexibility may be used, thereby allowing fabrication using a roll. Accordingly, it may be possible to allow a rapid fabrication of the lighting apparatus 100, and reduce fabrication cost.

Hereinafter, a lighting apparatus according to the present disclosure and a fabrication method using a roll process of a lighting device having a typical structure will be described, and advantages of the fabrication process of the lighting device according to the present disclosure will be described.

FIGS. 9A through 9E are views illustrating a fabrication method of the lighting apparatus 100 according to the present disclosure. At this time, the fabrication process of the lighting apparatus 100 is carried out on a plastic film on which successive processes are carried out by the roll fabrication apparatus, and in particular, as illustrated in FIG. 4, the lighting apparatus 100 is fabricated by a roll fabrication apparatus in which a part of the film is blocked by a shielding portion.

Figure 9A:
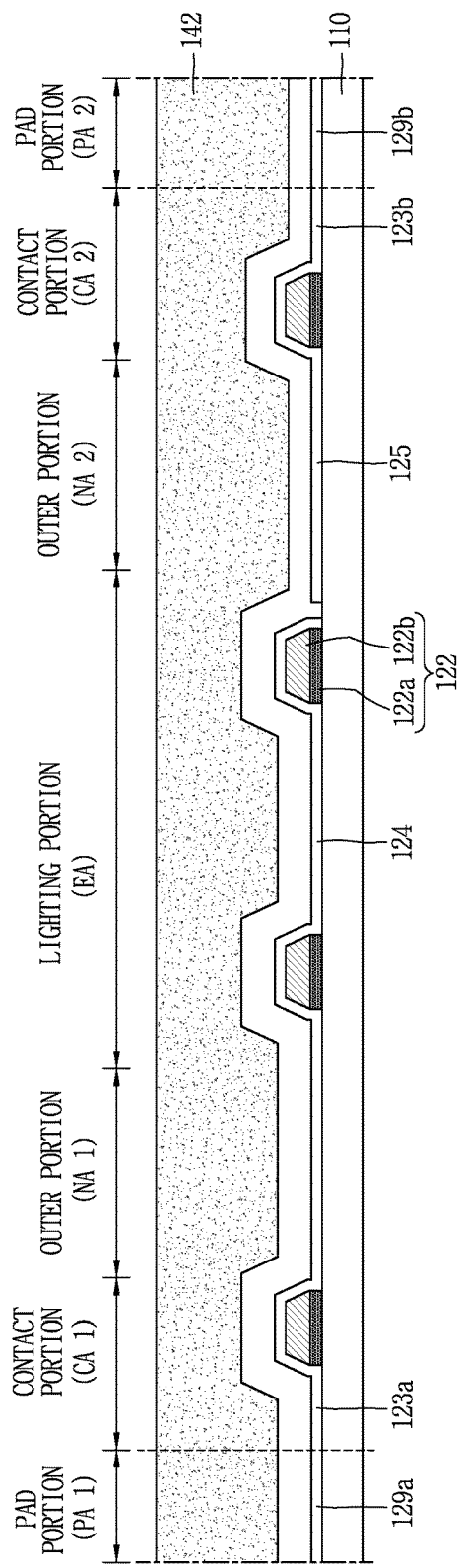
FIGS. 9A through 9E are views specifically illustrating a fabrication method of a lighting apparatus according to the present disclosure.

First, as illustrated in FIG. 9A, a metal such as Au, Cu, Ti, W, and Mo or an alloy thereof is deposited and etched on the substrate 110 including the lighting portion (EA), the outer portions (NA1, NA2) and the contact portions (CA1, CA2) to form the auxiliary electrode 122 made of a single layer or a plurality of layers on the lighting portion (EA) and the contact portions (CA1, CA2). Here, the auxiliary electrode 122 is disposed in a matrix shape, a mesh shape, a hexagonal shape, an octagonal shape, and a circular shape over the entire lighting portion (EA).

Then, a transparent conductive material such as ITO and IZO is deposited and etched over the entire substrate 110 to form the first electrode 124 disposed on the auxiliary electrode 122 of the lighting portion (EA), the first outer portion (NA1) and the contact portions (CA1, CA2) and the connection pattern 125 disposed on the second outer portion (NA2), and the first and the second aging pad 129a, 129b, the first and the second pad line 123a, 123b on the pad portions (PA1, PA2) and the contact portions (CA1, CA2), respectively. Subsequently, an inorganic insulating layer 113 such as $SiN_x$ and $SiO_x$ and an organic insulating layer 142 such as photoacryl are successively deposited on the lighting portion (EA), the outer portions (NA1, NA2) and the contact portions (CA1, CA2).

At this time, the auxiliary electrode 122, the first electrode 124, the connection pattern 125, the first and the second aging pad 129a, 129b, and the first and the second pad line 123a, 123b may be formed by a successive photolithography process in the roll fabrication apparatus or formed by a typical photolithography process.

Figure 9B:
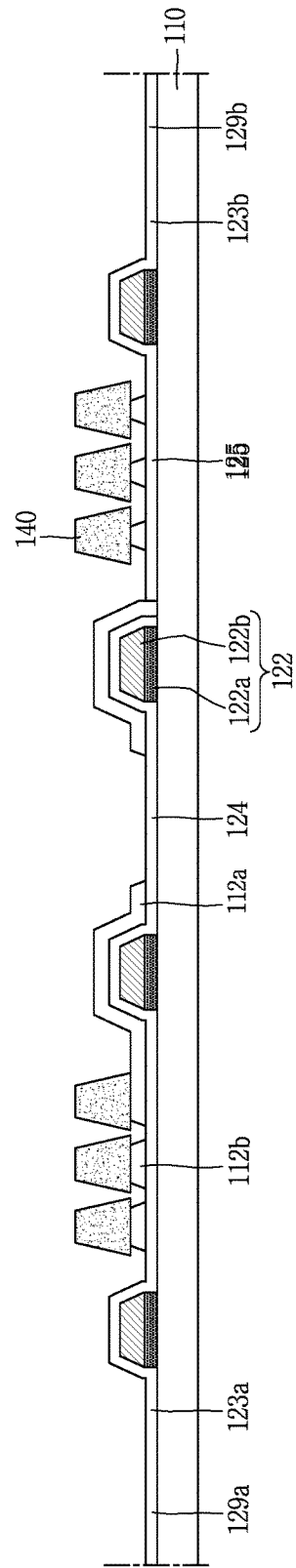

Then, as illustrated in FIG. 9B, the inorganic insulating layer 113 and the organic insulating layer 142 are etched to form the bank layer 140 on the outer portions (NA1, NA2), and form the first protective layers 112a, 112b on an upper portion and a side portion of the electrode 122 of the auxiliary portion of the lighting portion (EA), and a lower portion of the bank layer 140 of the outer portions (NA1, NA2).

Here, the inorganic insulating layer 113 and the organic insulating layer 142 are etched by wet etching using an etching solution, and the inorganic insulating layer 113 is over-etched and the first protective layer 112b below the bank layer 140 is undercut. The bank layer 140 may be formed by a roll fabrication apparatus or formed by a typical photolithography process.

Figure 9C:
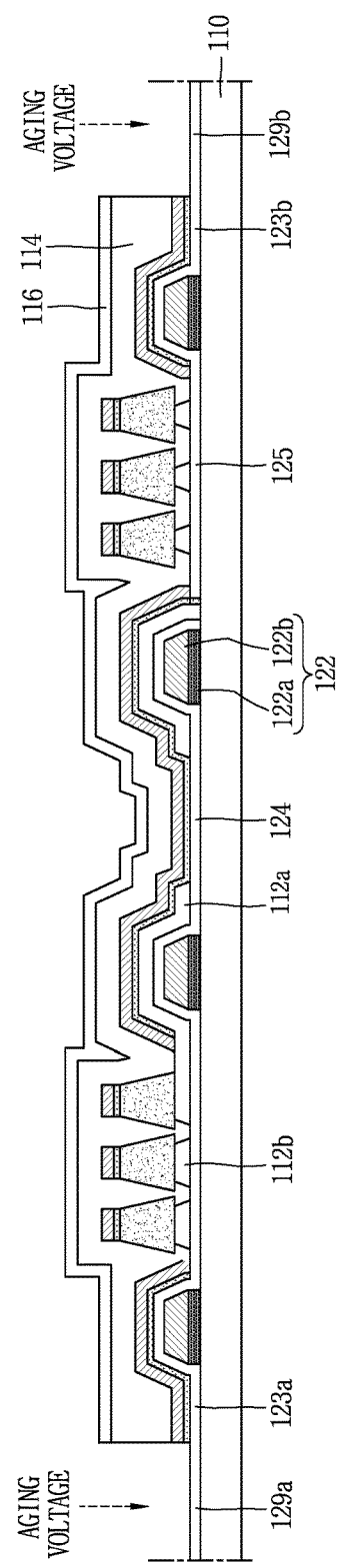

Then, as illustrated in FIG. 9C, an organic light emitting material, a metal, an organic insulating material and a sealant are entirely deposited in a sequential manner over an entire region of the substrate 110 to form the organic light emitting layer 130, the second electrode 126, the first protective layer 114 and the sealant 116. At this time, the organic light emitting layer 130, the second electrode 126, the first protective layer 114, and the sealant 116 are formed while at the same time a substrate film is successively transported on the roll fabrication apparatus.

The pad portions (PA1, PA2), which are the edge regions of the film, are blocked by a shielding portion when an organic light emitting material, a metal, an organic insulating material, and a sealant are entirely deposited using the roll fabrication apparatus illustrated in FIG. 4, and thus the organic light emitting material, the metal, the organic insulating material, and the sealant are not deposited on the first aging pad 129a and the second aging pad 129b, but the first aging pad 129a and the second aging pad 129b are exposed to the outside.

On the other hand, the bank layer 140 having a height of about 1 μm is formed on the outer portions (NA1, NA2) to form a step, and moreover, a discontinuous surface is formed by the undercutting of the first protective layer 112 below the bank layer 140, and thus, the organic light emitting material and the metal are deposited only on an upper surface of the bank layer 140 but not deposited on a discontinuous surface on a side surface and a lower portion of the bank layer 140 when depositing the organic light emitting material and the metal. Accordingly, it may be possible to prevent the organic light emitting layer 130 from infiltrating into the lighting portion (EA) along the organic light emitting layer 130 that is disconnected from the outer portions (NA1, NA2) and exposed to the outside.

On the other hand, the second electrode 126 is also disconnected by the bank layer 140, but the second electrode 126 of the lighting portion (EA) is electrically connected to the auxiliary electrode 122 of the second contact portion (CA2) by the connection pattern 125 disposed on the second outer portion (NA2).

The second protective layer 114 is formed of an organic insulating material and deposited with a thickness of several micrometers, and thus deposited over the entire substrate 110 including an upper portion and a side portion of the bank layer 140, and the sealant 116 is formed of an epoxy compound, an acrylate compound or an acrylic resin.

During the deposition of the sealant 116, terminals of an external voltage source are brought into contact with the exposed first aging pad 129a and the second aging pad 129b, respectively, and a high-voltage aging voltage is applied. The first aging pad 129a and the second aging pad 129b are connected to the first electrode 124 and the second electrode 126 through the first pad line 123a and the second pad line 123b, respectively, and the aging voltage applied to the first aging pad 129a and the second aging pad 129b is supplied to the first electrode 124 and the second electrode 126 through the first pad line 123a and the second pad line 123b to age the organic light emitting layer 130.

On the other hand, the aging voltage may be applied during the deposition of the sealant 116, but may be also applied after the deposition of the sealant 116 is completed. In other words, the application of the aging voltage may be carried out at any steps during the fabrication process of the lighting apparatus after the first aging pad 129a and the second aging pad 129b are connected to the first electrode 124 and the second electrode 126, respectively.

Figure 9D:
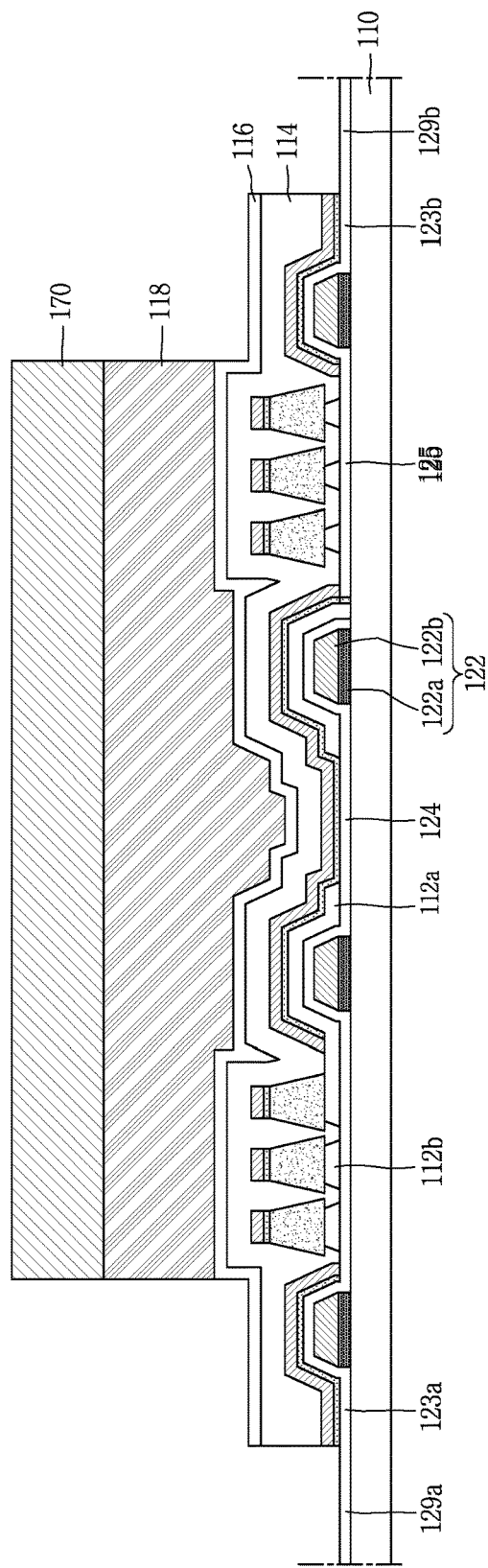

Then, as illustrated in FIG. 9D, an adhesive 118 made of a photocuring adhesive material or a thermosetting adhesive material is coated on the substrate 110, and a metal foil 170 is placed thereon, and then the adhesive 118 is cured to attach the metal foil 170 thereto.

Figure 9E:
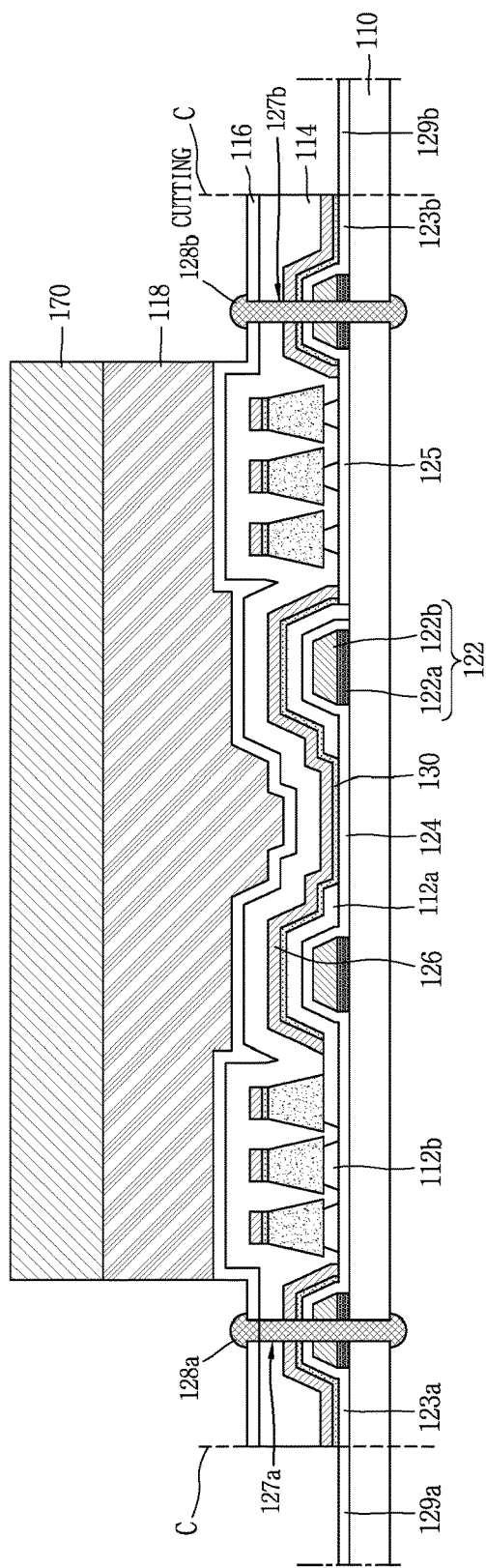

Then, as illustrated in FIG. 9E, a first through hole 127a and a second through hole 127b are formed on the auxiliary electrode 122 of the contact portions (CA1, CA2), respectively, and then Ag is coated thereon to form the first contact electrode 128a electrically connected to the first electrode 124 through the first contact hole 127a, and the second contact electrode 128b electrically connected to the second electrode 126 through the second contact hole 127b to complete the lighting apparatus 100. Here, instead of forming the first through holes 127a and the second through holes 127b on the auxiliary electrodes 122 of the contact portions (CA1, CA2), the first and second contact holes may be formed, and the first contact electrode 128a and the second contact electrode 128b may be formed in the first contact hole and the second contact hole, respectively.

Then, the substrate 110 and a structure thereon are cut along a cutting line (C) formed on the contact portions (CA1, CA2) to complete the lighting apparatus 100. As illustrated in FIGS. 3A and 3B, since a plurality of lighting apparatuses 100 are formed on a film, the film should be cut to separate each lighting apparatus 10 to complete the fabrication of each lighting apparatus 1000. During the cutting of the film, the first aging pad 129a and the second aging pad 129b are removed, and only the first pad line 123a and the second pad line 123b remain on the contact portions (CA1, CA2) of the lighting apparatus 100.

The cutting of the substrate 110 and the structure thereon may be carried out by various methods. For example, it may be cut by a mechanical cutting wheel, cut by a laser or cut by both a cutting wheel and a laser.

As described above, according to the present disclosure, an organic light emitting layer may be entirely deposited on a substrate without using an open mask, and an aging pad that is not covered by the organic light emitting layer may be provided to age the organic light emitting layer through the aging pad during the entire deposition of the organic light emitting layer. However, the present disclosure may not be limited to such a structure, but may also be applicable to various structures.

For example, according to the lighting apparatus having the structure illustrated in FIG. 7, in order to entirely deposit the organic light emitting layer without the open mask, a bank layer may be provided to disconnect the organic light emitting layer within the lighting apparatus so as to prevent moisture from being propagated along the organic light emitting layer, but, the present disclosure may not be limited to the lighting apparatus having such a structure. A lighting apparatus having a structure in which the organic light emitting layer and the second electrode disposed at an outside of the lighting portion are disconnected to propagate moisture into the lighting apparatus from the outside may also be applicable to the present disclosure.

Various modification examples of the present disclosure, a structure that can be easily devised based on the present disclosure or the like should be included in the scope of the present disclosure. Accordingly, the rights scope of the present disclosure should not be determined by the foregoing detailed description but determined in accordance with the appended claims.

What is claimed is:
1. A lighting apparatus, comprising:
    a substrate comprising a lighting portion, an outer portion, and a contact portion;

an organic light emitting device on the substrate and including a first electrode, an organic light emitting layer, and a second electrode; and a first pad line and a second pad line at the contact portion respectively connected to the first electrode and the second electrode, wherein the first pad line and the second pad line are covered with the organic light emitting layer at the lighting portion, the outer portion, and the contact portion, and wherein the first pad line and the second pad line are exposed to outside through a side edge of the contact portion.

2. The lighting apparatus of claim 1, further comprising:
a step structure in an outer portion of the substrate to disconnect the organic light emitting layer at the lighting portion from the light emitting layer at the outer portion and the contact portion.

3. The lighting apparatus of claim 2, wherein the step structure is tapered or reverse tapered.

4. The lighting apparatus of claim 2, wherein the organic light emitting layer is disposed on an upper surface of the step structure and not disposed on a sidewall of the step structure.

5. The lighting apparatus of claim 1, wherein the organic light emitting layer at the outer portion is disconnected by a laser.

6. The lighting apparatus of claim 1, further comprising:
an auxiliary electrode at the lighting portion and the contact portion, the auxiliary electrode connected to the first electrode.

7. The lighting apparatus of claim 6, wherein the auxiliary electrode is arranged in a matrix shape, a mesh shape, an octagonal shape, a hexagonal shape, and a circular shape at the lighting portion with a predetermined width.

8. The lighting apparatus of claim 6, further comprising first and second through holes at the contact portion.

9. The lighting apparatus of claim 8, further comprising:
a first contact electrode and a second contact electrode at the contact portion and electrically connected to the first electrode and the second electrode, respectively, through the first and second through holes.

10. The lighting apparatus of claim 1, wherein the first pad line and the second pad line are formed of the same material as that of the first electrode.

11. The lighting apparatus of claim 1, further comprising:
a first protective layer over the substrate; and
at least one of a sealant and a second protective over the first protective layer.

12. The lighting apparatus of claim 11, further comprising a metal foil attached to the at least one of the sealant and the second protective layer.

* * * * *